United States Patent [19]

Klein

[11] Patent Number: 5,526,553
[45] Date of Patent: Jun. 18, 1996

[54] SNAP-LOCK SPRING CLIP ATTACHMENT SYSTEM

[75] Inventor: Peter P. Klein, Phoenixville, Pa.

[73] Assignee: Unisys Corporation, Blue Bell, Pa.

[21] Appl. No.: 327,640

[22] Filed: Oct. 24, 1994

[51] Int. Cl.⁶ .................................................. A44B 21/00
[52] U.S. Cl. .................... 24/295; 24/289; 24/294
[58] Field of Search ............................. 24/295, 294, 293, 24/292, 291, 289, 453, 563

[56] References Cited

U.S. PATENT DOCUMENTS

| | | | |
|---|---|---|---|
| 2,105,706 | 1/1938 | Stamy | 24/295 |
| 2,305,122 | 12/1942 | Wiley | 24/295 |
| 2,666,245 | 1/1954 | Fernberg et al. | 24/259 |
| 2,689,027 | 9/1954 | Flora | 189/88 |
| 2,751,106 | 6/1956 | Schrader | 220/9 |
| 2,857,633 | 10/1958 | Bunker | 20/19 |
| 3,631,569 | 1/1972 | Seckerson et al. | 24/295 |
| 3,970,346 | 7/1976 | Kretschmer | 301/37 |
| 3,977,048 | 8/1975 | Benedetti | 24/73 |
| 4,092,766 | 6/1978 | Meyer | 24/73 |
| 4,296,530 | 10/1981 | Muller et al. | 24/295 |
| 4,383,716 | 5/1983 | Osborn | 301/37 |
| 4,402,118 | 9/1983 | Benedetti | 24/289 |
| 4,461,514 | 7/1984 | Schwarz | 301/37 |
| 4,644,612 | 2/1987 | Osterland | 24/295 |
| 4,683,622 | 8/1987 | Oehlke | 24/295 |
| 5,101,540 | 4/1992 | Roof et al. | 24/295 |
| 5,347,690 | 9/1994 | Mansoor et al. | 24/295 |

FOREIGN PATENT DOCUMENTS

| | | | |
|---|---|---|---|
| 1166865 | 11/1958 | France | 24/294 |

Primary Examiner—Victor N. Sakran
Attorney, Agent, or Firm—Woodcock Washburn Kurtz Mackiewicz & Norris

[57] ABSTRACT

A spring clip for releasably attaching a first member, such as the carrier of a fascia panel cover, to a second member, such as an electric component rack module. The spring clip is anchored to a support plate extending from carrier. The spring clip has two forwardly extending U-shaped spring elements that cooperate with a locking tab and a rearwardly extending U-shaped spring element. Deformation of the forwardly extending spring elements during installation of the spring clip causes the locking tab to snap onto the lower edge of the support plate, thereby firmly anchoring the spring clip to the support plate. A latch extending from the rack module engages the rearwardly extending spring element so as to secure the fascia cover panel to the rack module. Application of a force to the rearwardly extending spring element causes elastic deformation of the forwardly extending spring elements and disengages the locking tab.

18 Claims, 5 Drawing Sheets

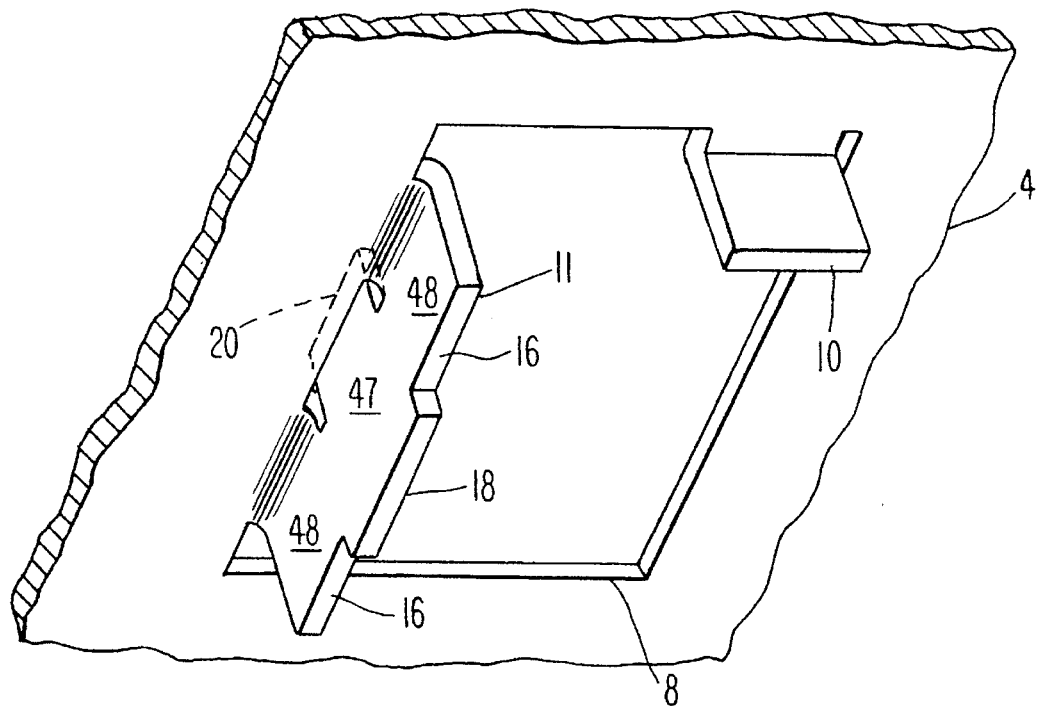
_Fig. 3_
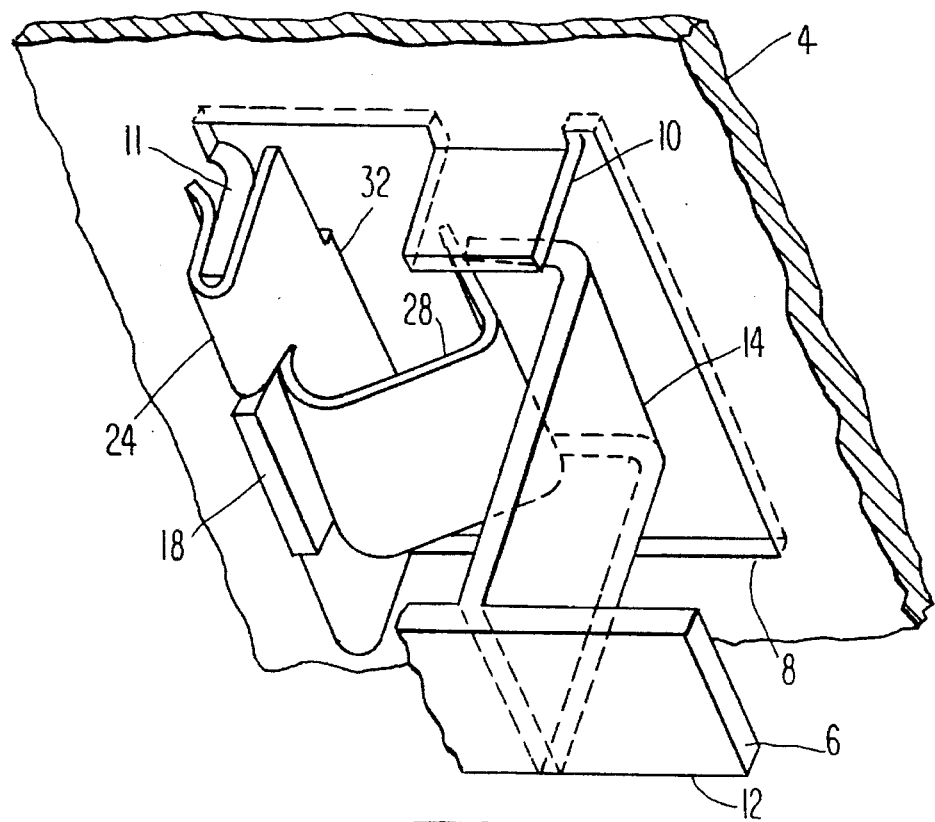
_Fig. 8_

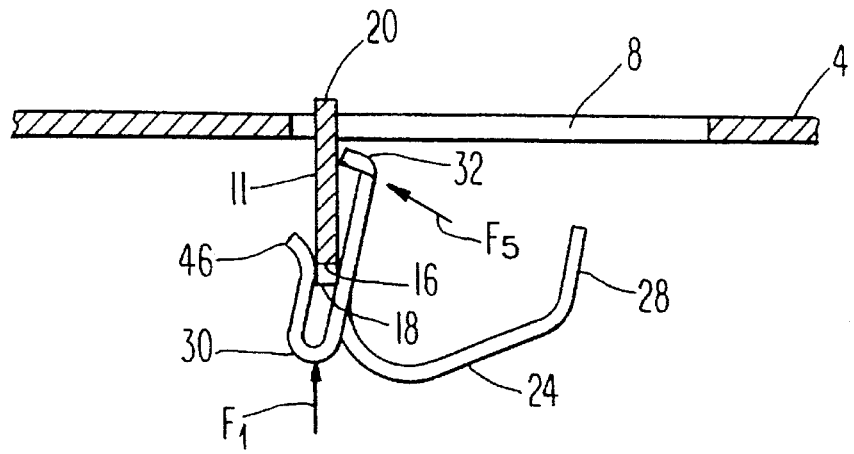
_Fig. 5_
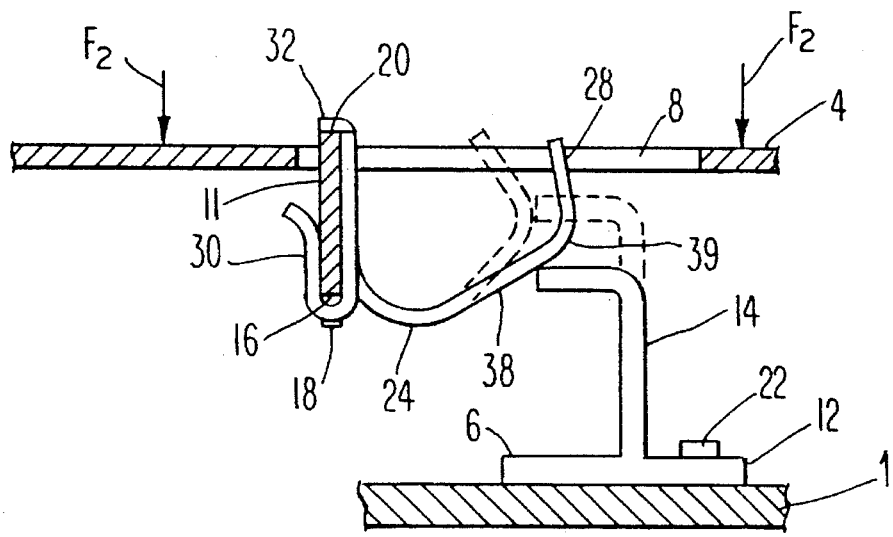
_Fig. 6_
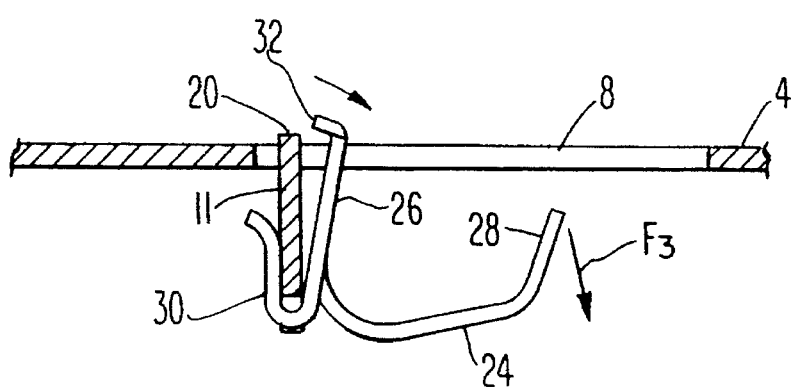
_Fig. 10_

SNAP-LOCK SPRING CLIP ATTACHMENT SYSTEM

FIELD OF THE INVENTION

The current invention is directed to a spring clip for attaching two members. More specifically, the current invention is directed to a spring clip having a snap-lock feature that allows a panel to be releasably attached to a support member.

BACKGROUND OF THE INVENTION

A variety of spring clip devices have been used in the past for releasably attaching two members together—that is, attaching the members in a manner that allows them to be readily detached and then re-attached. One example of the application of such spring clips is in the attachment of a fascia cover panel to a rack module containing electronic equipment. Such spring clips typically have a barbed anchoring device. The spring clips are semi-permanently attached to the panel by inserting the barbed anchoring device into a slot in the panel. The barbs dig into, or at least microscopically penetrate, the wall of the slot. At assembly, a bracket projecting from the rack module is forced over a U-shaped spring portion extending from the clip, thereby securing the fascia cover panel to the rack module.

If the spring clip fails or is damaged, a not infrequent occurrence, it must be replaced. Unfortunately, although spring clips of the type heretofore known in the art allow the fascia cover panel to be readily removed, the clip itself is not easily removed from the panel because the barbs must be dis-engaged from the slot. Moreover, such dis-engagement often results in damage to the slot surface, thereby decreasing the ability of the slot to anchor the replacement clip.

Consequently, it would be desirable to provide a spring clip for releasably attaching two members that although firmed anchored to one of the members, could be easily removed in the event that the spring clip had to be replaced.

SUMMARY OF THE INVENTION

It is a feature of the current invention to provide a spring clip system for releasably attaching two members that, although firmly anchored to one of the members, can be easily removed in the event that the spring clip had to be replaced. This and other features is accomplished in a system for releasably attaching a first member, such as the carrier of a fascia cover panel, to a second member, such as an electric component rack module. The releasable attaching system of the current invention includes (i) a support plate that extends from a carrier portion of the fascia cover panel, (ii) an L-shaped latch extending from the rack module, and (iii) a spring clip adapted to be firmly anchored to the support plate without penetrating or otherwise damaging its surface.

The support plate extends from the edge of an opening in the carrier. It is approximately rectangular in shape and has upper and lower edges. Two shoulders are formed along the end portions of its upper edge and a ridge is formed along the center portion of its lower edge.

The spring clip has (i) two spaced apart and forwardly projecting U-shaped spring elements extending from its upper edge, (ii) a locking tab extending approximately perpendicularly from its lower edge, and (iii) a rearwardly projecting U-shaped spring element extending from the center portion of the upper edge between the two forwardly projecting spring elements.

To install the spring clip onto the support plate, the forwardly projecting spring elements are placed over the shoulders on the support plate upper edge. A force is then applied to slide the spring clip further onto the support plate until the locking tab snaps over the ridge at the bottom edge of the support plate, thereby placing the support plate between the locking tab and the forwardly projecting spring elements so as to firmly anchor the spring clip to the support plate.

To install the fascia cover panel, the latch is pressed against the rearwardly projecting spring element so as to become trapped behind a knee in the spring element. The fascia cover panel is removed by merely applying sufficient force to elastically deform the rearwardly projecting spring element so as to disengage the latch from knee.

The spring clip is replaced by merely applying sufficient pulling force to the rearwardly projecting spring element. This causes the forwardly projecting spring clip elements to elastically deform sufficiently to allow the locking tab to be released from its engagement with the ridge on the lower edge of the support plate, thereby releasing the spring clip.

BRIEF DESCRIPTION OF THE DRAWINGS

FIG. 3 is an isomeric view similar to FIG. 2 but looking in the opposite direction.

FIG. 5 is a cross-section showing the spring clip being installed on the fascia cover panel carrier.

FIG. 6 is a cross-section similar to FIG. 5 showing the fascia cover panel carrier being installed on the rack module bracket.

FIG. 8 is an isometric view similar to FIG. 7 showing the fascia cover panel carrier installed on the rack module bracket.

FIG. 10 is a cross-section similar to FIG. 5 showing the spring clip being removed from the fascia cover panel carrier.

DESCRIPTION OF THE PREFERRED EMBODIMENT

Figure 1:
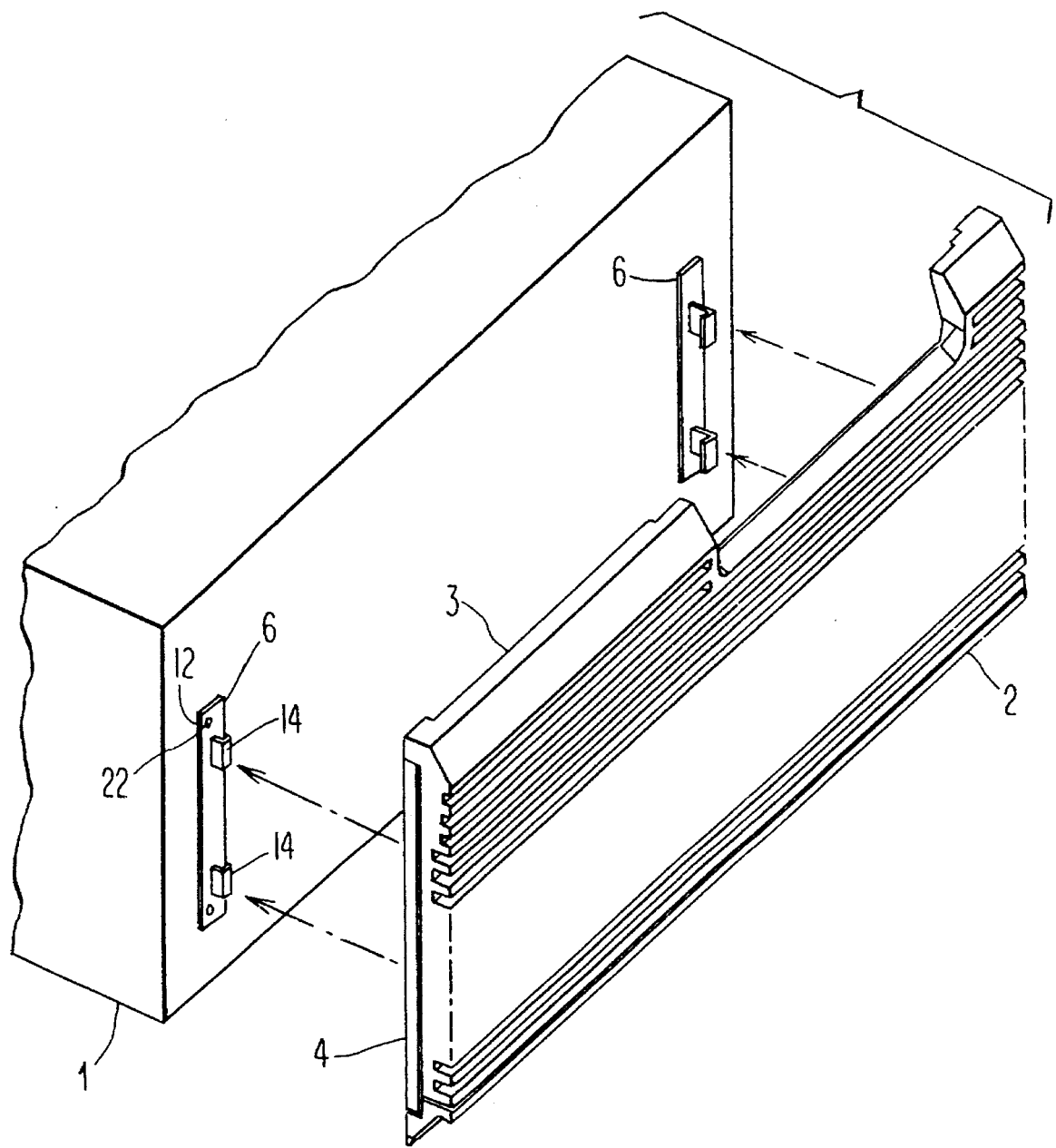
FIG. 1 is an exploded isometric view, partially schematic, of an electronic rack module and its fascia cover panel assembly employing the spring clip of the current invention.

FIG. 1 is an exploded view showing a rack module 1, such that used to house electronic components in a computer, and its decorative fascia cover panel assembly 2. The fascia cover panel assembly 2 is comprised of a sheet metal carrier 4 and a molded plastic cover 3 that is attached to the carrier 4. Since the components of the spring clip system according to the current invention are formed on the carrier 4, the plastic cover 3 has been omitted from the remaining figures and the invention explained with reference to the carrier 4 only. However, it should be understood that the plastic cover 3 is attached to the carrier 4 during the assembly and disassembly operations discussed below.

Since access must frequently be gained to the rack module 1, for example for purposes of maintenance, the fascia cover panel assembly 2 is releasably attached to the rack module using the spring clip system of the current invention. Accordingly, as shown in FIG. 1, two mounting brackets 6, each of which features two L-shaped latches 14, are attached to the face of the rack module 1 using, for example, screws 22.

Figure 2:
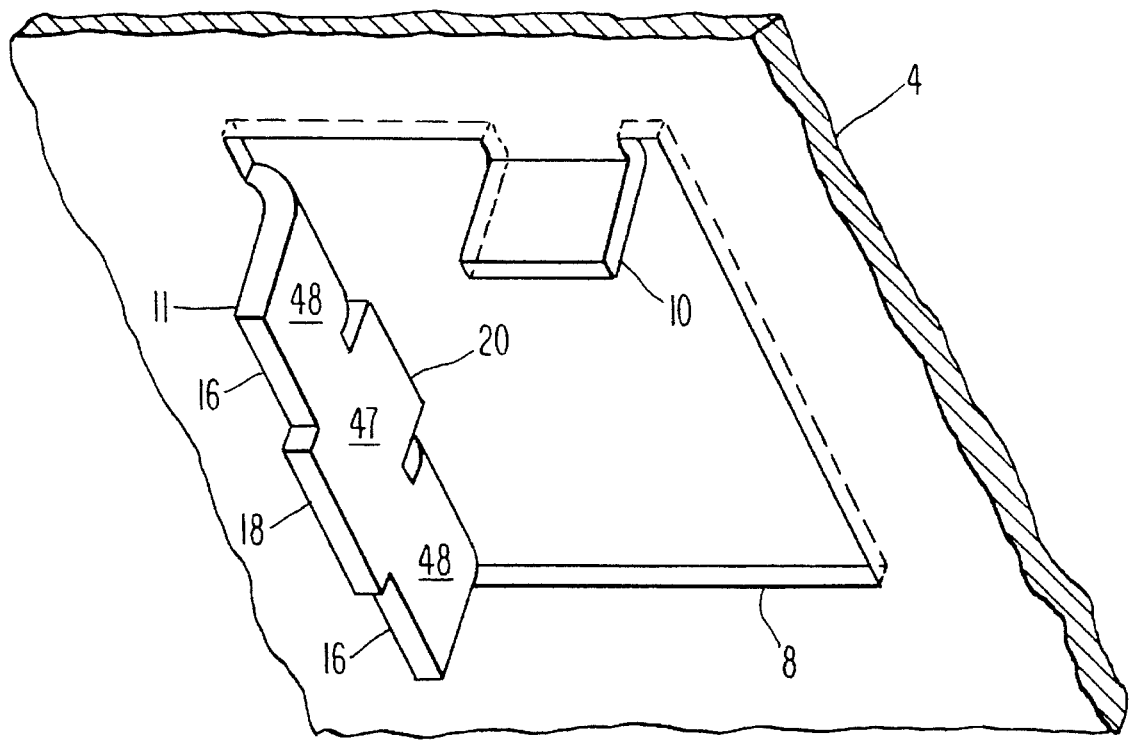
FIG. 2 is an isometric view of the portion of the fascia cover panel carrier shown in FIG. 1 in the vicinity of the spring clip support plate.

The carrier 4 has openings 8, one of which is shown in FIGS. 2 and 3, that are spaced so as to be aligned with each of the bracket latches 14. At each opening 8, an approximately rectangular support plate 11 extends perpendicularly from the planar surface of the carrier 4 in the direction toward the rack module 1. Each support plate 11 has a center portion 47 flanked on either side by end portions 48. In addition, the support plate 11 has a free edge at its distal end that forms a ridge 18 along the central portion 47 as well as two recessed shoulders 16 along the end portions 48. Another edge at the proximal end of the support plate 11 forms a raised ridge 20 along the center portion 47. The end portions 48 are attached to the edge of the opening 8 at their proximal ends. As explained further below, the support plate 11 forms an anchoring device for anchoring the spring clip of the current invention to the carrier 4. In addition, a tab 10 extends perpendicularly from the planar surface of the carrier 4 toward the rack module 1.

Figure 4:
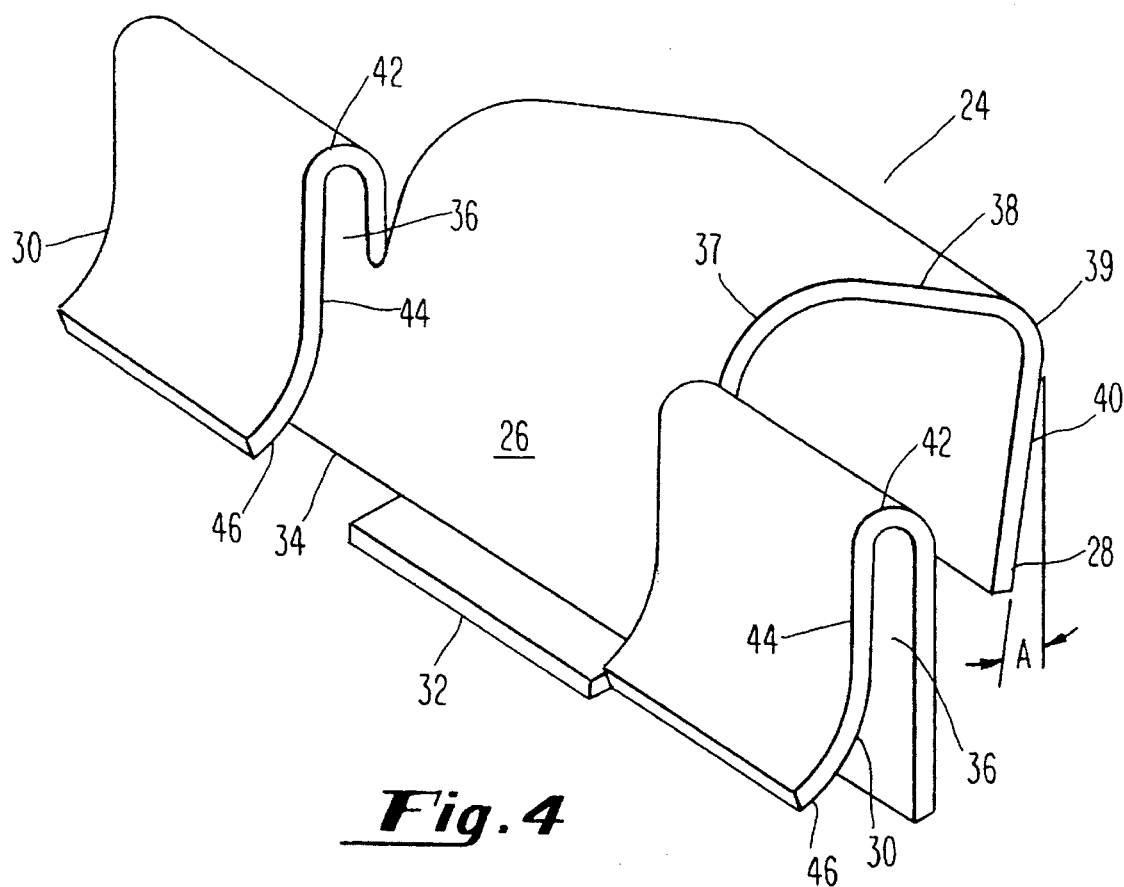
FIG. 4 is an isometric view of the spring clip of the current invention.

The spring clip 24 according to the current invention is shown in FIG. 4. The spring clip 24 is comprised of a center body portion 26 from which three approximately U-shaped spring elements and a locking tab 32 extend. Preferably, the spring clip 24 is formed from a material suitable for use in springs, such as heat treated beryllium copper.

The first U-shaped spring element 28 extends rearwardly from the upper edge of the spring clip body 26 and is comprised of an arcuate section 37 that extends from the center body 26 and two essentially straight legs 38 and 40 that are connected along a knee 39. Preferably, in the undeformed state, the leg 40 is not parallel to the center body portion 26 but forms an acute angle A with respect to it. In the preferred embodiment, the angle A is approximately 5°.

The second and third U-shaped spring elements 30 extend forwardly from the upper edge of the spring clip body 26 and are each comprised of a first arcuate section 42 attached to the center body, a straight leg 44, and a second arcuate edge section 46 that extends forwardly away from the center body portion 26. The leg 44 is spaced from the forward face of the center body portion 26 so as to form a retaining cavity 36.

The locking tab 32 extends forwardly from the lower edge 34 of the spring clip body 26 at an angle of approximately 90°.

The installation of the spring clip 24 onto the carrier support plate 11 is shown in FIG. 5. Initially, the spring elements 30 are placed over the shoulders 16 of the support plate 11, relying to the arcuate edges 46 to aid the spring elements 30 in slipping over the shoulders. The raised ridge 18 of the support plate 11 helps to ensure that the spring clip 24 is properly centered on the support plate during the installation process. In this position, the locking tab 32 rests against the face of the support plate center portion 47, as shown in FIG. 5.

Figure 7:
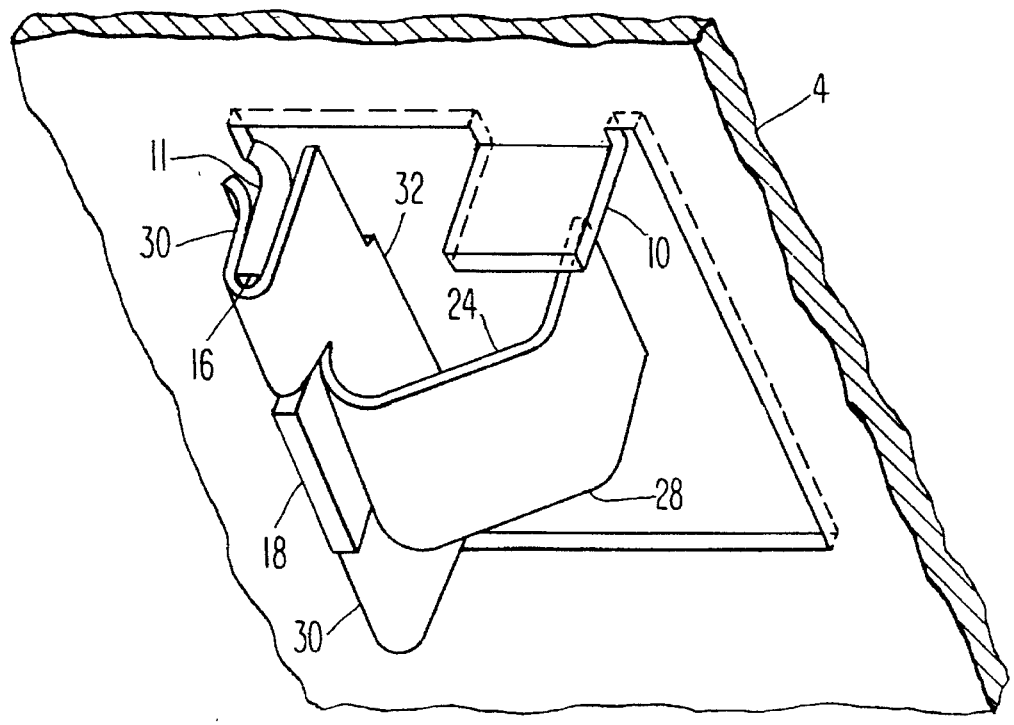
FIG. 7 is an isometric view similar to FIG. 2 showing the spring clip installed on the fascia cover panel carrier support plate.

A force $F_1$ is then applied, as shown in FIG. 5, that causes the spring elements 30 to elastically deform, thereby allowing the spring clip 24 to slide down onto the support plate 11. The deformation of the spring elements 30 creates a spring force $F_5$ that causes the locking tab 32 to be pressed against the face of the support plate 11. When the spring clip 24 has been pressed down sufficiently far onto the support plate 11, the locking tab 32 "snaps" over the ridge 20. In the installed position, the end portions 48 of the support plate 11 are enclosed within the cavities 36 of the spring clip 24, as shown in FIGS. 6 and 7. The "snapping" of the locking tab 32 over the edge of the support plate 11 provides assurance that the support plate is firmly secured between the locking tab 32 and the spring elements 30.

Preferably, the distance between the leg 44 and the spring clip center body 26—that is, the width of the cavity 36—is less than the thickness of the end portions 48 of the support plate 11 so that the spring elements 30 apply a compressive force to the support plate that ensures engagement of the locking tab 32 and stable mounting of the spring clip 24. Also, the distance between each of the apexes of the arcuate sections 42 of the spring elements 30 and the locking tab 32 is slightly less than the distance from the ridge 20 to the shoulders 16 of the support plate 11. This further ensures that the locking tab 32 will remain firmly seated against the ridge 20, thereby providing further stability in the anchoring of the spring clip 24 to the support plate 11. According to an important aspect of the current invention, the spring clip 24 is firmly anchored to the support plate 11 without penetrating or otherwise compromising its surface.

After the four spring clips 24 have been firmly anchored to the carrier support plates 11, the carrier 4 is then positioned adjacent the rack module 1 so that the spring clips are aligned with bracket latches 14, as shown in FIG. 6. A force $F_2$ is then applied to press the carrier 4 against the rack module 1. The latches 14 are spaced with respect to the spring clips 24 so that the latches contact the legs 38 of the spring elements 28. This causes the spring elements 28 to elastically deformed inwardly, as shown in phantom in FIG. 6, thereby allowing the latches 14 slip over the knees 39 in the spring elements.

Figure 9:
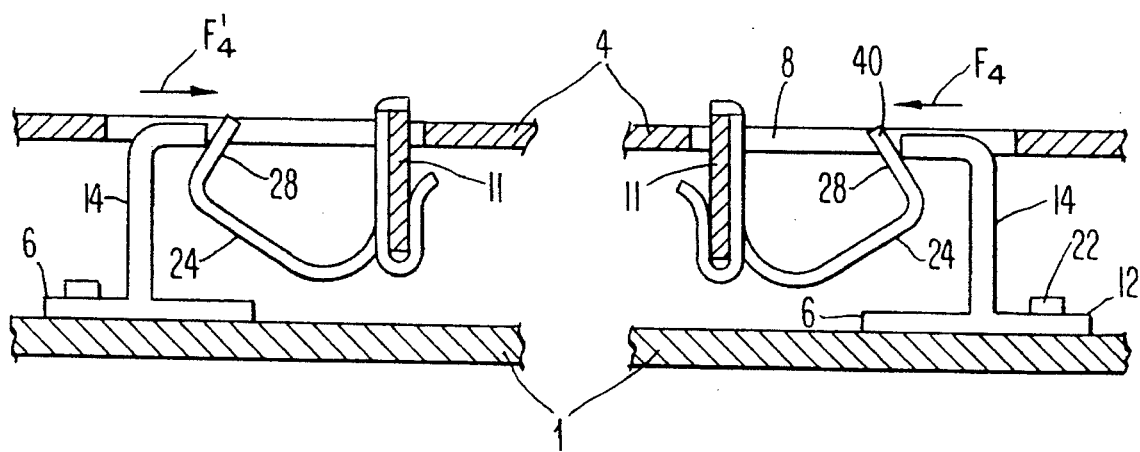
FIG. 9 is a cross-section through the fascia cover panel carrier and the rack module showing two spring clips in operation.

When the installation is completed, the ends of latches 14 are disposed behind the knees 39 of the spring elements 24, as shown in FIGS. 8 and 9. This prevents the carrier 4 from being pulled away from the rack module 1 unless sufficient force is applied to again deform the spring elements 28 so that the latches 14 can slip past the knees 39 of the spring clips 24. As a consequence, the carrier 4 is securely, but releasably, attached to the rack module 1.

In the preferred embodiment, the latches 14 are spaced with respect to the spring clips 24 so that, when completely installed, the legs 40 of the spring elements 28 press against the latches so that the spring elements remain in a partially elastically deformed state, as shown in FIG. 9. Looking at the right hand spring clip 24 shown in FIG. 9, it can be seen that as a result of this interference, the latch 14, acting through the spring element 28, creates a spring force $F_4$ that presses the spring clip 24 against the face of the support plate 11, thereby ensuring that the locking tab 32 does not become disengaged in service.

Thus, the spring element 28 serves not only to attach the carrier 4 to the rack module 1 and to stabilize the carrier 4 in the lateral direction, as discussed below, it also acts in conjunction with the spring elements 30 to ensure that the locking tab 32 maintains its engagement with the ridge 20 and that the spring clip 24 remains firmly anchored to the support plate 11 in service.

The force $F_4$ also tends to drive the carrier 4 toward the left. However, the force $F_4$ is opposed by a similarly created force $F_4'$ from the left hand spring clip 24 that tends to drive the carrier 4 to the right. As a consequence, the forces $F_4$ and $F_4'$ tend to restrain relative movement between the carrier 4 and the rack module 1 in the direction parallel to the carrier face, thereby stabilizing the carrier 4 on the rack module 1.

As shown in FIG. 8, when the latch 14 has been captured by the spring element 28, the tab 10 rests on the latch, thereby providing vertical support for the carrier 4.

To remove the carrier 4 from the rack module 1, a sufficient pulling force is applied normal to the surface of the carrier to deform the spring elements 28 and allow the latches 14 to once again slip past the knees 39 in the spring elements.

In the event that a spring clip 24 must be replaced, one need merely apply a sufficient pulling force $F_3$ to the spring element 28, which forms a convenient finger grip, to elastically deform the spring elements 30, as shown in FIG. 10. This causes the center body portion 26 of the spring clip 24 to pull away from the support plate 11, thereby disengaging the locking tab from the ridge 20. According to an important aspect of the invention, the removal of the spring clip 24 is not only easily performed, but it does not in any way damage the support plate 11. Thus, the effectiveness of the replacement spring clip will not be compromised.

Although the invention has been explained with reference to the attachment of a fascia cover panel assembly to an electronic component rack module, the invention is applicable to the joining of other members, especially removable panels. Accordingly, the present invention may be embodied in other specific forms without departing from the spirit or essential attributes thereof and, accordingly, reference should be made to the appended claims, rather than to the foregoing specification, as indicating the scope of the invention.

What is claimed:

1. A releasable mounting system, comprising:

a) a first member;

b) a second member having a support plate extending therefrom, said support plate having a first edge formed thereon; and c) clip means for releasably mounting one of said members onto the other of said members, said clip means having (i) a first spring element extending therefrom, (ii) locking means for locking said clip means onto said support plate, said locking means including a locking tab extending from said clip means and engaging said first edge of said support plate, at least a first portion of said support plate being releasably secured between said first spring element and said locking tab, and (iii) means for releasing said locking means by elastically deforming said first spring element.

2. The mounting system according to claim 1, further comprising means for creating a first spring force urging said tab into engagement with said support plate first edge.

3. The mounting system according to claim 2, wherein said means for creating said first spring force comprises said first spring element.

4. The mounting system according to claim 1, wherein said means for releasing said locking means by elastically deforming said first spring element comprises a second spring element.

5. The mounting system according to claim 4, wherein said second spring element has means for engaging said first member.

6. The mounting system according to claim 4, wherein said first and second spring elements extend outward from said clip means in approximately opposite directions.

7. A releasable mounting system, comprising:

a) a first member;

b) a second member having a support plate extending therefrom, said support plate having a first edge formed thereon; and c) clip means for releasably mounting one of said members onto the other of said members, said clip means having (i) a first spring element extending therefrom, (ii) locking means for locking said clip means onto said support plate, at least a first portion of said support plate being releasably secured between said first spring element and said locking means, said locking means having a locking tab extending from said clip means, and engaging said first edge of said support plate, (iii) means for creating first and second spring forces urging said tab into engagement with said support plate first edge, and (iv) means for releasing said locking means by elastically deforming said first spring element.

8. The mounting system according to claim 7, wherein said means for creating said second spring force comprises a second spring element.

9. The mounting system according to claim 8, wherein said first and second spring elements extend outward from said clip means in approximately opposite directions.

10. The mounting system according to claim 8, wherein said first and second spring elements extend outward from said clip means in approximately the same direction.

11. A releasable mounting system, comprising:

a) a first member;

b) a second member having a support plate extending therefrom, said support plate having first and second edges formed thereon, said second edge disposed opposite said first edge; and c) clip means for releasably mounting one of said members onto the other of said members, said clip means having (i) a first spring element extending therefrom, said first spring element enclosing said second edge of said support plate, and (ii) locking means for locking said clip means onto said support plate, at least a first portion of said support plate being releasably secured between said first spring element and said locking means, said locking means having a locking tab extending from said clip means and engaging said first edge of said support plate, and (iii) means for releasing said locking means by elastically deforming said first spring element.

12. The mounting system according to claim 11, wherein said first spring element in approximately U-shaped.

13. A panel for mounting on a support structure, comprising:

a) an anchor attached to said panel and extending therefrom, said anchor having upper and lower edges;

b) a clip attached to said anchor, said clip having (i) a body having upper and lower portions, (ii) a first spring member projecting forwardly from said body upper portion and engaging said upper edge of said anchor, (ii) a second spring member projecting from said body, and (iii) a locking tab projecting forwardly from said body lower portion and engaging said lower edge of said anchor, said anchor being disposed between said first spring member and said locking tab, whereby said first spring member and said locking tab cooperate to permit said clip to snap onto said anchor.

14. The panel according to claim 13, wherein said first spring member is approximately U-shaped, said first spring member and said clip body forming a cavity therebetween, said anchor being retained within said cavity by said locking tab.

15. The panel according to claim 13, wherein said first spring member has a leg portion, said anchor disposed between said leg portion and said clip body.

16. The panel according to claim 13, wherein said clip further comprises a third spring member projecting forwardly from said upper portion of said clip and engaging said upper edge of said anchor, said second spring member disposed between said first and third spring members.

17. A detachable fastener system for releasably attaching two members without penetrating any surfaces of said members, comprising:

a) an anchor projecting from one of said members, said anchor having an edge formed thereon;

b) a clip having a body portion having a lower edge and first and second faces;

c) a first spring member elastically coupled to said body, said first spring member extending outwardly from said body first face and then downwardly toward said body lower edge, said body first face and said first spring member forming a retaining cavity therebetween having means for retaining said anchor therein;

d) means for locking said anchor within said retaining cavity including a projection extending outwardly from said body first face and spaced a predetermined distance from said first spring member, said projection engaging said edge of said anchor; and e) a second spring member elastically coupled to said body, said second spring member extending outwardly from said body second face and then downwardly toward said lower body edge.

18. The fastener system according to claim 17, wherein said first spring member is approximately U-shaped.

* * * * *